United States Patent [19]

Oglesbee

[11] Patent Number: 4,744,550

[45] Date of Patent: May 17, 1988

[54] VACUUM WAFER EXPANDER APPARATUS

[75] Inventor: Ivan W. Oglesbee, Phoenix, Ariz.

[73] Assignee: ASM America, Inc., Phoenix, Ariz.

[21] Appl. No.: 855,841

[22] Filed: Apr. 24, 1986

[51] Int. Cl.⁴ .................. B23P 17/00; B25B 11/00
[52] U.S. Cl. ........................... 269/21; 29/281.4;
   29/413; 225/2; 225/96
[58] Field of Search .......... 29/413, 281.4; 269/21;
   225/2, 96

[56] References Cited

U.S. PATENT DOCUMENTS

| | | |
|---|---|---|
| 2,970,730 | 2/1961 | Schwarz ............... 29/413 |
| 3,537,169 | 11/1970 | Eigemen et al. ....... 29/413 |
| 3,562,058 | 2/1971 | Boyd .................... 29/413 |
| 3,657,791 | 4/1972 | Hobbs ................... 29/413 |
| 3,677,875 | 7/1972 | Althouse ............... 29/413 |
| 3,727,282 | 4/1973 | Neary .................... 29/413 |
| 3,918,150 | 11/1975 | Gantley ................. 29/413 |
| 4,296,542 | 10/1981 | Gotman ................. 29/413 |

Primary Examiner—Carl E. Hall
Attorney, Agent, or Firm—Harry M. Weiss & Associates

[57] ABSTRACT

A vacuum wafer expander apparatus and method of wafers for use in electrical circuitry. A plurality of electronic semiconductor devices being connected to a flexible member means suitable for are mounted on a brace or bracket frame member means. The brace or bracket frame member means is suitable for being removably mounted on a bracket mounting means having a groove therearound for accommodating a vacuum therein to allow an abutting portion of the flexible material to be pushed in said groove; thus expanding the flexible member means as well as the plurality of electronic semiconductor devices thereon. The electronic semiconductor devices can thereafter be optically inspected and individually picked up from the flexible member means for processing.

8 Claims, 3 Drawing Sheets

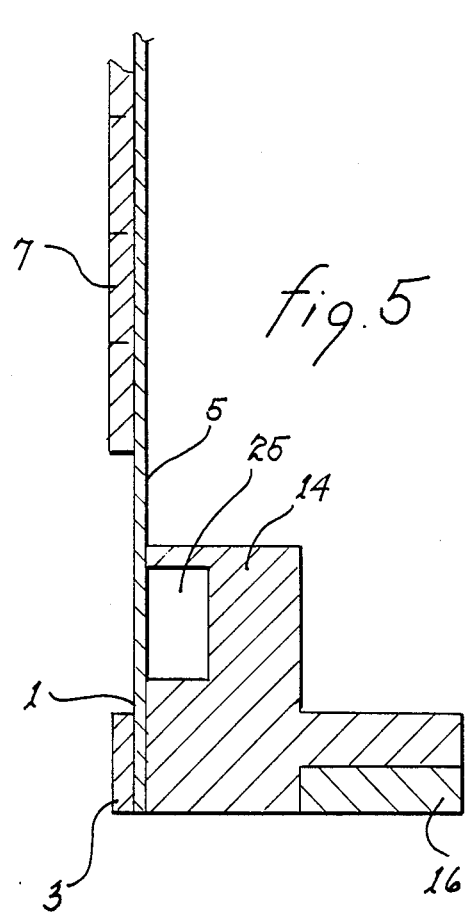
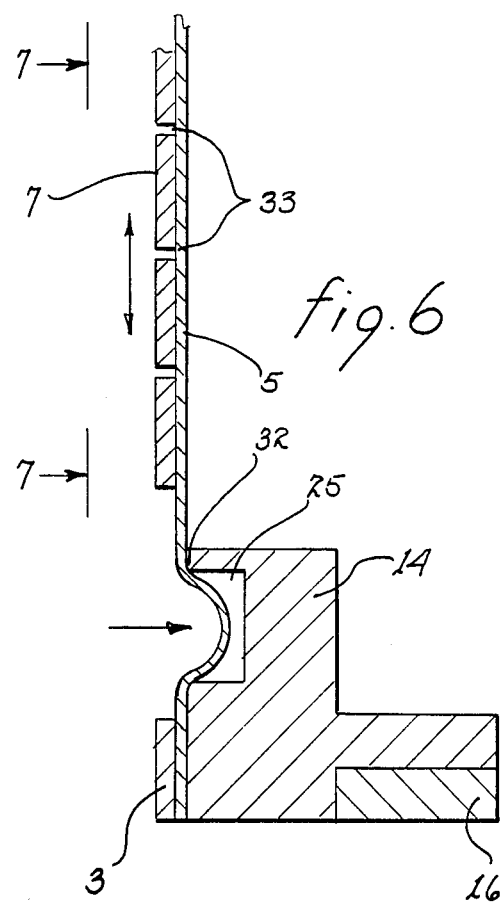
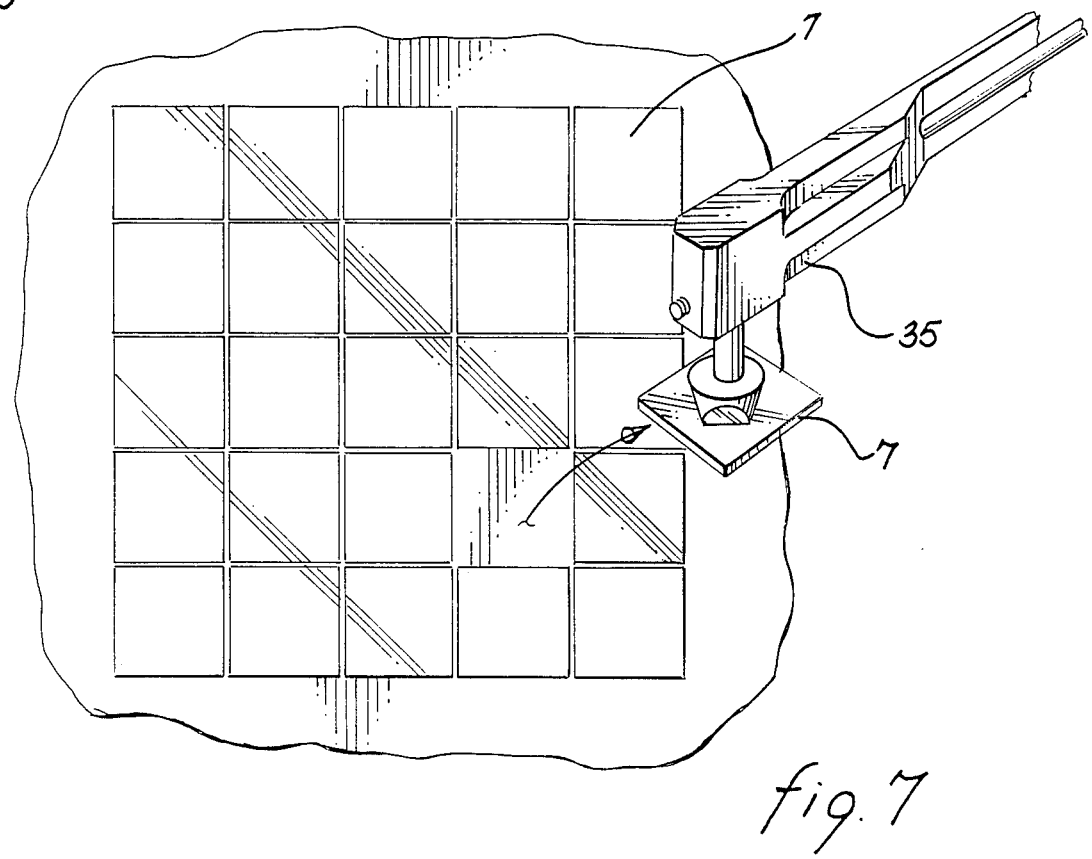

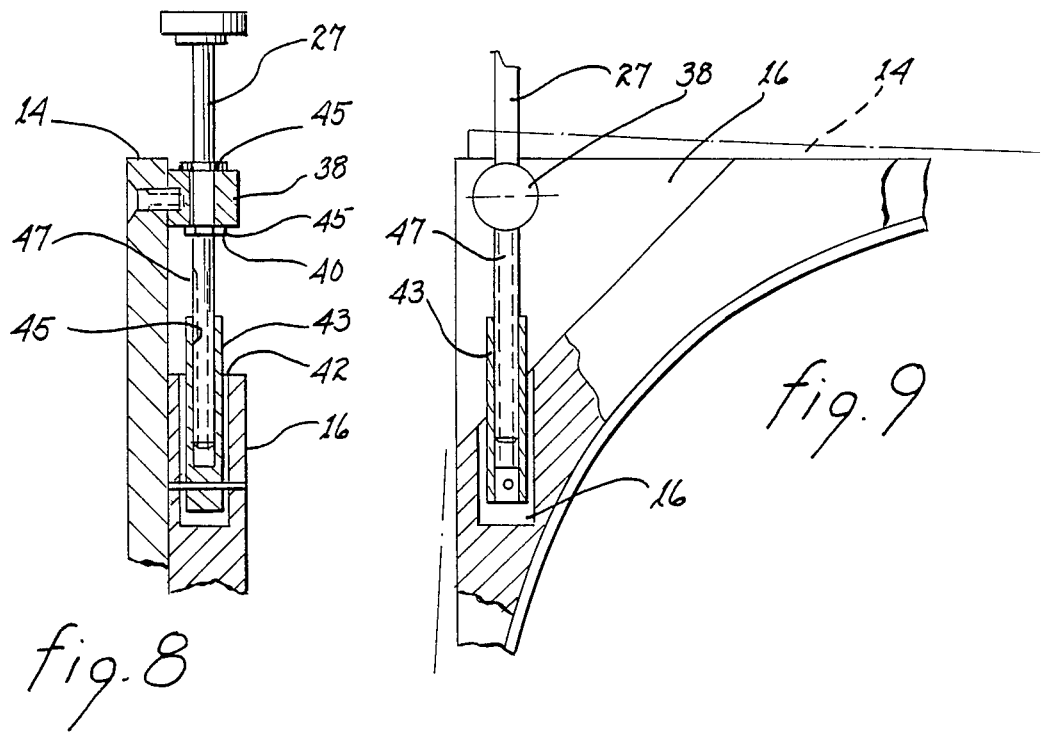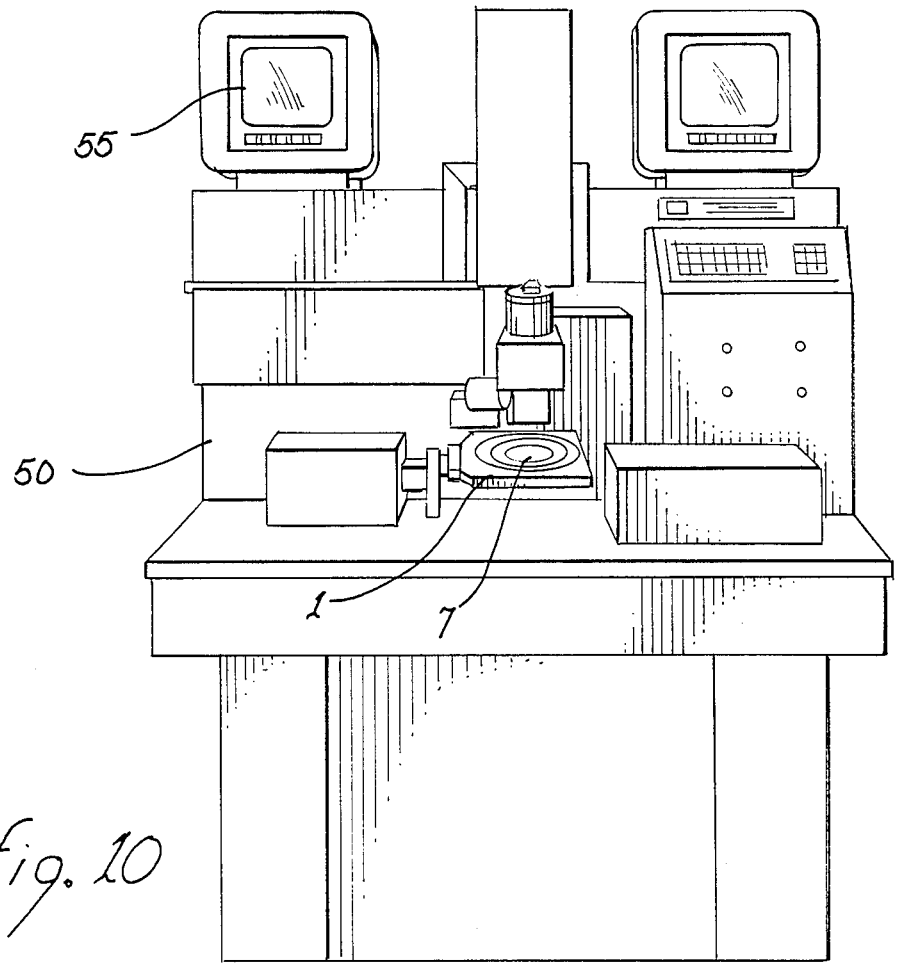

VACUUM WAFER EXPANDER APPARATUS

BACKGROUND OF THE INVENTION

This invention relates generally to a vacuum wafer expander apparatus and method of making wafers for use in electronic circuitry. More particularly, the invention relates to diced wafers comprising a plurality of electronic semiconductor devices being connected to a flexible member being mounted on a bracket member means. The bracket member means is suitable for being removably mounted on a bracket mounting means having a groove therearound for accommodating a vacuum therein to allow an abutting flexible material to be pulled into said groove; thus expanding the flexible member as well as the diced wafer of electronic semiconductor devices connected thereto.

It is known that appratuses for use in examining wafers are readily available. Further apparatuses suitable for expanding wafers by use of abutting members having the wafers located therebetween wherein an abutting member physically impinges upon the flexible member against an opposing member to cause the wafers to expand. However, the existing apparatus, as described, is cumbersome and expensive. Also, the expansion derived therefrom tends not to be uniform due to the extraneous friction forces applied onto the surfaces of the flexible material when the wafer expansion procedure is in operation.

Accordingly, there is a dire need for an efficient, economical, simply constructed and easily installed vacuum wafer expander apparatus and method for mounting onto an easily accessible wafer inspection and processing apparatus and suitable for efficiently and uniformly expanding a plurality of electronic semiconductor devices. Moreover, the vacuum wafer expander apparatus and method of the present invention embodies a simply constructed combination of inexpensive, easily accessible and rapidly manufactured parts, yet efficient to function in effectively expanding wafers for inspection and processing.

SUMMARY OF THE INVENTION

It is an object of the present invention to provide a wafer vacuum expander apparatus and method for use generally in expanding a diced wafer having a plurality of semiconductor devices for inspection and processing thereof.

It is still another object of the present invention to provide a wafer expander apparatus and method for use in removably mounting onto a bracket mounting member suitable for accommodating a vacuum means to expand said wafers.

It is a further object of the present invention to provide a wafer expander apparatus and method for mounting onto a readily available wafer inspection and processing apparatus.

It is a further object of the present invention to provide a wafer expander apparatus and method which may be economically assembled in a compact form having few parts which may be operably coupled to an easily accessible wafer inspection and processing apparatus.

It is yet a further object of the present invention to provide a wafer expander apparatus and method which may be removably mounted onto a bracket mounting means suitable for being adjusted in an incremental manner when a plurality of electronic semiconductor devices are being inspected and processed thereon.

It is yet a further object of the present invention to accomplish the above by a wafer expander apparatus and method utilizing therefrom parts which will be durable in construction, long lasting, economical and efficient when in use.

The foregoing and other object, features and advantages of this invention will be apparent from the following, more particular description of the preferred embodiments of this invention, as illustrated in the accompanying drawings.

BRIEF DESCRIPTION OF THE DRAWINGS

FIG. 5 is a cross-sectional view taken along line 5—5 of FIG. 3 showing the manner in which a flexible member joined therebelow a plurality of electronic semiconductor devices is initially placed thereabove the associated mounting member of the wafer expander apparatus of the present invention.

FIG. 6 is a sequential view of FIG. 5 showing the manner in which the flexible member is pulled into an associated groove inherent to the mounting member.

FIG. 7 is a perspective view of the manner in which a pick-up tool member lifts up at least one electronic semiconductor device from the associated flexible member.

FIG. 8 is a partial cross-sectional view taken along line 8—8 of FIG. 3 showing the manner in which an adjusting screw member is operably coupled to the associated mounting member.

FIG. 9 is a partial cross-sectional view taken along line 9—9 of FIG. 3 further showing the manner in which the adjusting screw member is operably coupled to the associated mounting member.

FIG. 10 is a front perspective view of a wafer inspection and processing apparatus suitable for accommodating therein the vacuum wafer apparatus of the present invention.

DESCRIPTION OF THE PREFERRED EMBODIMENT

Figure 1:
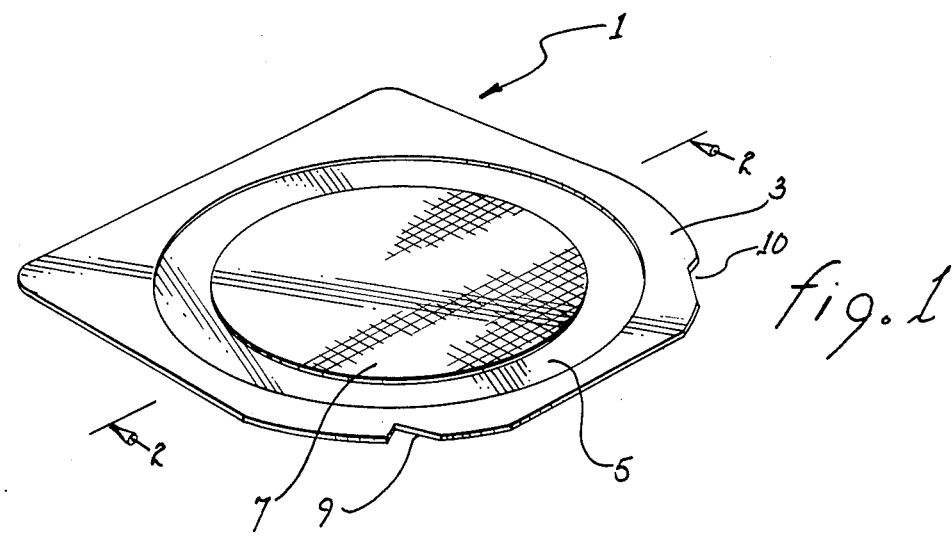
FIG. 1 is a perspective view of a conventional wafer holder apparatus for attaching to a wafer inspection and processing apparatus.
Figure 2:
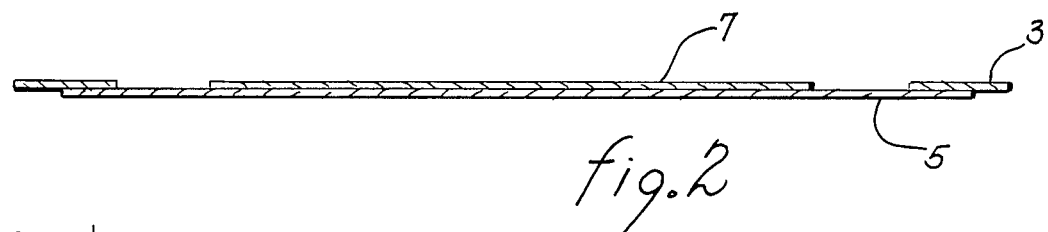
FIG. 2 is a side elevational view of the wafer holder apparatus.

FIG. 1 is a perspective view of a conventional wafer holder, generally referred to be reference number 1, generally comprising a brace or bracket member 3, a flexible member 5, and a diced wafer having a plurality of electronic semiconductor devices 7 attached thereto. The brace or bracket member 3 is preferably configured like a ring to permit coverage therearound the flexible member 5. Also, the brace member 3 has at least one indented portion 9, 10 for being accommodated by at least one pin 12 integral to an upper portion 14 of a mounting bracket member 16 (see FIG. 3, infra). In FIG. 2, the wafer holder 1 is shown in a side elevational view for purposes of illustrating the relative connective positioning of the brace or bracket member 3, the flexible member 5, and the diced wafer having a plurality of electronic semiconductor devices 7.

Figure 3:
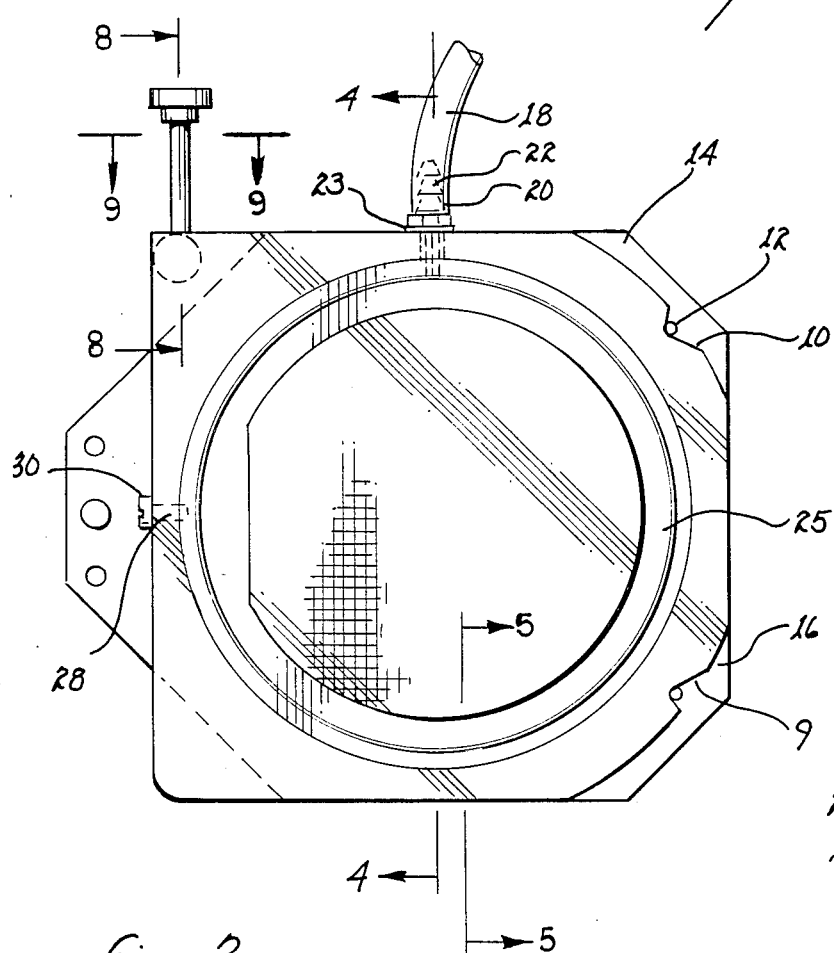
FIG. 3 is a top elevational view of the vacuum wafer expander apparatus of the present invention with an associated vacuum hose member connected to a mounting member.

As illustrated in FIG. 3, the wafer holder 1 is mounted on the upper portion 14 of the mounting bracket member 16 wherein the indented portions 9, 10 of the brace member 3 abut the pins 12 on the mounting bracket member 16. As further shown in FIG. 3, a tubular member 18 is accommodated in a snug fitting manner onto a vacuum spout member 20, having a series of inclined precipices 22, integrally connected to the upper portion 14 of the mounting bracket member 16. Between the spout member 20 and the mounting bracket member 16 a washer member 23 snugly fitted thereto as a sealant when the vacuum wafer holder 1 is in use. The tubular member 18 is connected to a vacuum-producing apparatus (not shown).

The upper portion 14 of the mounting bracket member 16 has a groove 25 therearound to permit a vacuum to develop therein when the wafer holder 1 is in use, as will later be discussed. To create a suitable vacuum, an aperture 28 passes therethrough the upper portion 14 to allow the accommodtion of another spout member (not shown) therein, if desired. When the aperture 28 is not in use, a bolt member 30 is accommodated therein to suitably sustain the vacuum developed in the groove 25.

Figure 4:
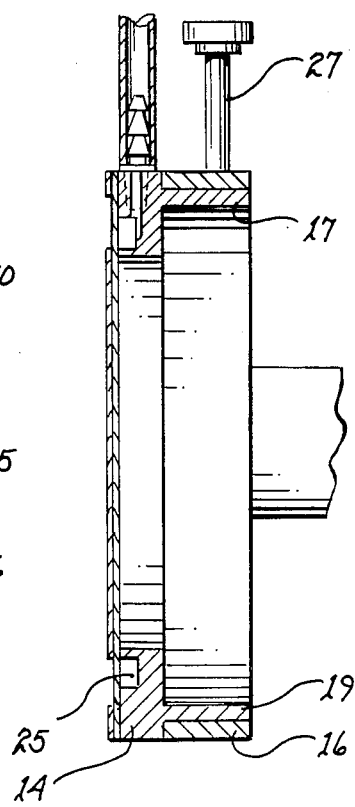
FIG. 4 is a cross-sectional view taken along line 4—4 of FIG. 3 showing the manner in which the wafer holder apparatus mounts onto the associated mounting member of the vacuum expander apparatus of the present invention.

As better illustrated in FIG. 4, the upper portion 14 is fitted onto the mounting bracket member 16. Here, the upper portion 14 has a downwardly protruding member 17 integral thereto for abutting onto the internal surface portion 19 of the mounting bracket member 16. As also illustrataed in FIG. 4, the groove 25 is shown being located therebelow the flexible member 5 of the vacuum wafer expander 1. Integral to the mounting bracket member 16 is an adjusting screw member 27 for adjusting the position of the upper portion 14 relative to the mounting bracket member (see FIGS. 8-9, infra).

In FIG. 5, the wafer holder 1 is not in use, but simply mounted on the upper portion 14 of the mounting bracket member 16. Here, the flexible member 5 merely sits above the groove 25. In the FIG. 6, a vacuum is developed inside the groove 25; thus having the flexible member 5 thereabove pulled therein. upon the pulling of the flexible member 5 into the groove 25, the flexible member 5 is expanded; thus similarly expanding the diced wafer having a plurality of electronic semiconductor devices 7 connected thereabove. In order minimize the friction created therebetween the flexible member 5 and the upper portion 14, a chamfered portion 32 integral to the upper portion is provided.

Upon expansion, the electronic semiconductor devices 7 can be inspected and processed. The electronic semiconductor devices 7 are separated from each other when the flexible member 5 is expanded producing therefrom gaps 33 therebetwen. When separated from each other, each electronic semiconductor device 7 can be individually picked up by a conventional pick-up tool member 35, as shown in FIG. 7, infra. In FIG. 7, the pick-up tool member 35 may operate by means of a vacuum or the like. As also shown in FIG. 7, as well as shown in FIG. 5, the plurality of electronic semiconductor devices 7 have been initially scribed or sawn then broken apart to allow ease in the development of the gaps 33 therebetween when expanded.

In FIG. 8, a cross-sectional view is shown wherein an adjusting screw member 27 is operably connected to the upper portion 14 for location adjustment relative to the mounting bracket member 16. Here, the adjustment is made in a manner such that the X-Y relationship between the upper portion 14 and the mounting bracket member 16 can be manipulated for purposes of inspection of the plurality of electronic semiconductor devices 7 when expanded. As further shown in FIG. 8, the adjusting screw member 27 is mounted onto the upper portion 14 by a preferably removable member 38 having an aperture 40 passing therethrough for accommodating therein the screw member 27. The mounting bracket member 16 has an opening portion 42 fo accommodating therein a tubular member 43 having internal threads 45 therein operably accommodating therein a threaded portion 47 of the screw member 27.

In FIG. 9, when the adjusting screw member 27 is in place and in use, a rotation of the screw member 27 in one direction allows the screw member 27 to be threaded into the tubular member 43; thus a ring stopper member 45, see FIG. 8 supra, is impinged onto the member 38 resulting in a motion of the upper portion 14 relative to the mounting bracket member 16.

As shown in FIG. 10, the vacuum wafer expander 1 can be accommodated by an inspection and processing apparatus 50, such as an ASM (Advanced Semiconductor Materials) Desert 2000 or 2000H model. The inspection and processing apparatus 50 is suitable, e.g., for bonding die to leadframes or to pick up and place the wafers for packaging. When used for inspection purposes, the vacuum wafer expander 1 can be conventionally mounted onto the inspection and processing apparatus 50 so that when the plurality of electronic semiconductor devices 7 are expanded, as previously discussed, the electronic semiconductor devices 7 can be "optically recognized" by use of at least one television monitor 55. When the electronic semiconductor devices 7 are being "optically recognized", a process of pattern recognition of wafer defects can be implemented throughout the electronic semiconductor devices 7. Defects in wafer areas such as the corners, sides and center sections can be monitored.

The flexible material 5 is preferably made out of mylar film or the like. Further, the brace or bracket member 3 is preferably made out of plastic or metal, such as stainless steel or the like. Also, the upper portion 14, the mounting bracket member 16, as well as the associated parts previously described therewith are preferably made out hard plastic or metal, such as aluminum or stainless steel.

While the invention has been particularly shown and described in reference to preferred embodiments thereof, it will be understood by those skilled in the art that changes in form and details may be made without departing from the spirit and scope of the invention.

I claim:

1. A vacuum wafer expander apparatus for mounting onto a wafer inspection and processing apparatus, comprising:

a planar substantially ring-shaped brace frame member having at least one indented portion around a circumference thereof for accommodating a pin therein and having an aperture substantially centered therethrough;

flexible member means for receiving electronic semiconductor wafers, said flexible member means being attached to said planar substantially ring-shaped brace and subtending said aperture substantially centered therethrough;

substantially planar mounting bracket member means having an upper portion for mounting said brace frame member means thereon and downwardly protruding member integral thereto, said upper portion having groove means therein for accommodating a portion of said flexible member means and having adjustment means operably coupled thereto for adjusting said upper portion relative to said mounting bracket member means; and a vacuum-producing apparatus operably joined to said upper portion of said mounting bracket member means for creating a vacuum in said groove means.

2. The vacuum wafer expander apparatus as in claim 1 wherein said flexible member is made of mylar film material.

3. The vacuum wafer expander apparatus as in claim 1 wherein said vacuum-producing apparatus is operably joined into said upper portion of said mounting bracket means by a tubular member fitted onto a spout member means integrally coupled to said upper portion of said mounting bracket means.

4. The vacuum wafer expander apparatus as in claim 1 wherein said adjusting means further comprises an adjusting screw member.

5. The vacuum wafer expander apparatus as in claim 4 wherein said brace frame member is made of a flexible metal.

6. The vacuum wafer expander apparatus as in claim 5 wherein said brace frame member is made of aluminum.

7. The vacuum wafer expander apparatus as in claim 4 wherein said mounting bracket member means is made of metal selected from the group of aluminum and stainless steel.

8. The vacuum wafer expander apparatus as in claim 4 wherein said mounting bracket member means is made of hard plastic.

* * * * *